(12) United States Patent
Kudo (10) Patent No.: US 6,921,936 B2
(45) Date of Patent: Jul. 26, 2005

(54) PN VARACTOR

(75) Inventor: Koji Kudo, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 90 days.

(21) Appl. No.: 10/406,391

(22) Filed: Apr. 4, 2003

(65) Prior Publication Data

US 2003/0197216 A1 Oct. 23, 2003

(30) Foreign Application Priority Data

Apr. 18, 2002 (JP) .......................................... 2002-116699

(51) Int. Cl.$^7$ .............................................. H01L 29/72
(52) U.S. Cl. ........................ 257/312; 257/313; 257/315; 257/316
(58) Field of Search ................................ 257/312, 313, 257/315, 316

(56) References Cited

U.S. PATENT DOCUMENTS

2002/0044012 A1 * 4/2002 Otsuka et al. ............... 327/586

FOREIGN PATENT DOCUMENTS

JP    2000-252480    9/2000

* cited by examiner

*Primary Examiner*—Edward Wojciechowicz
(74) *Attorney, Agent, or Firm*—Arent Fox PLLC (57) ABSTRACT

An object of this invention is to provide a pn-varactor having a small resistance and capable of coinciding with incorporation of a circuit employing LC resonance into an integrated circuit. A dummy gate pattern 4 is formed over a n-well 1 in a semiconductor wafer and then p$^+$ diffusion regions 2, 3 are formed on both sides with the dummy gate pattern 4 as inhibition mask. For the purpose, a control voltage VT higher than potentials of the p$^+$ diffusion regions 2, 3 is applied to the n-well 1. Consequently, both the pn-junction between the n-well 1 and the p$^+$ diffusion region 2 and the pn-junction between the n-well 1 and the p$^+$ diffusion region 3 act as a pn-varactor whose capacity is changed by the control voltage VT. If an end dummy pattern is provided on both sides or around the p$^+$ diffusion regions 2, 3, imbalance in capacity due to deflection in position is prevented.

18 Claims, 7 Drawing Sheets

PLAN VIEW AND SECTIONAL VIEW SHOWING STRUCTURE
OF DIFFERENTIAL pn VARACTOR WITH END DUMMY
PATTERN ARRANGED ON BOTH SIDES

FIG.1

PLAN VIEW AND SECTIONAL VIEW SHOWING MOST TYPICAL STRUCTURE OF DIFFERENTIAL pn VARACTOR DIRECTED TO EMBODIMENT

FIG.2

EQUIVALENT CIRCUIT DIAGRAM OF DIFFERANTIAL pn VARACTOR DIRECTED TO EMBODIMENT

FIG.3

PLAN VIEW AND SECTIONAL VIEW SHOWING STRUCTURE OF DIFFERENTIAL pn VARACTOR WITH END DUMMY PATTERN ARRANGED ON BOTH SIDES

FIG.4

PLAN VIEW AND SECTIONAL VIEW SHOWING STATE THAT DUMMY GATE PATTERN IS PLACED SLIGHTLY OFF FROM CENTER OF $P^+$ DIFFUSION REGION

FIG.5

PLAN VIEW SHOWING STRUCTURE OF DIFFERENTIAL pn VARACTOR WITH PATTERN : END DUMMY PATTERN AND DUMMY GATE PATTERN ARE DIRECTLY CONNECTED (1)

FIG.6

PLAN VIEW SHOWING STRUCTURE OF DIFFERENTIAL pn VARACTOR WITH PATTERN : END DUMMY PATTERN AND DUMMY GATE PATTERN ARE DIRECTLY CONNECTED (2)

FIG.7

PLAN VIEW SHOWING STRUCTURE OF DIFFERENTIAL pn VARACTOR FOUR SIDES OF WHICH IS SURROUNDED WITH END DUMMY PATTERN

FIG.8

PLAN VIEW SHOWING STRUCTURE OF DIFFERENTIAL pn VARACTOR THAT EMPLOYS CROSSED DUMMY GATE PATTERN AND ENDDUMMY PATTERN SURROUNDING FOUR SIDES

FIG.9
PLAN VIEW SHOWING STRUCTURE OF DIFFERENTIAL pn VARACTOR THAT EMPLOYS CROSSED DUMMY GATE PATTERN AND ENDDUMMY PATTERN ON BOTH ENDS

FIG.10

CIRCUIT DIAGRAM SHOWING STRUCTURE OF TYPICAL VCO CIRCUIT

PN VARACTOR

CROSS-REFERENCE TO RELATED APPLICATIONS

This application is based upon and claims the benefit of priority from each of the prior Japanese Patent Application No. 2002-116699 filed on Apr. 18, 2002, the entire contents of which are incorporated herein by reference.

BACKGROUND OF THE INVENTION

1. Field of the Invention

The present invention relates to a pn varactor that uses a pn junction as variable capacitance capacitor. More particularly, it relates to a pn varactor that has a small resistance and can cope with being built in an integrated circuit of a circuit that uses LC resonance.

2. Description of Related Art

Figure 10:
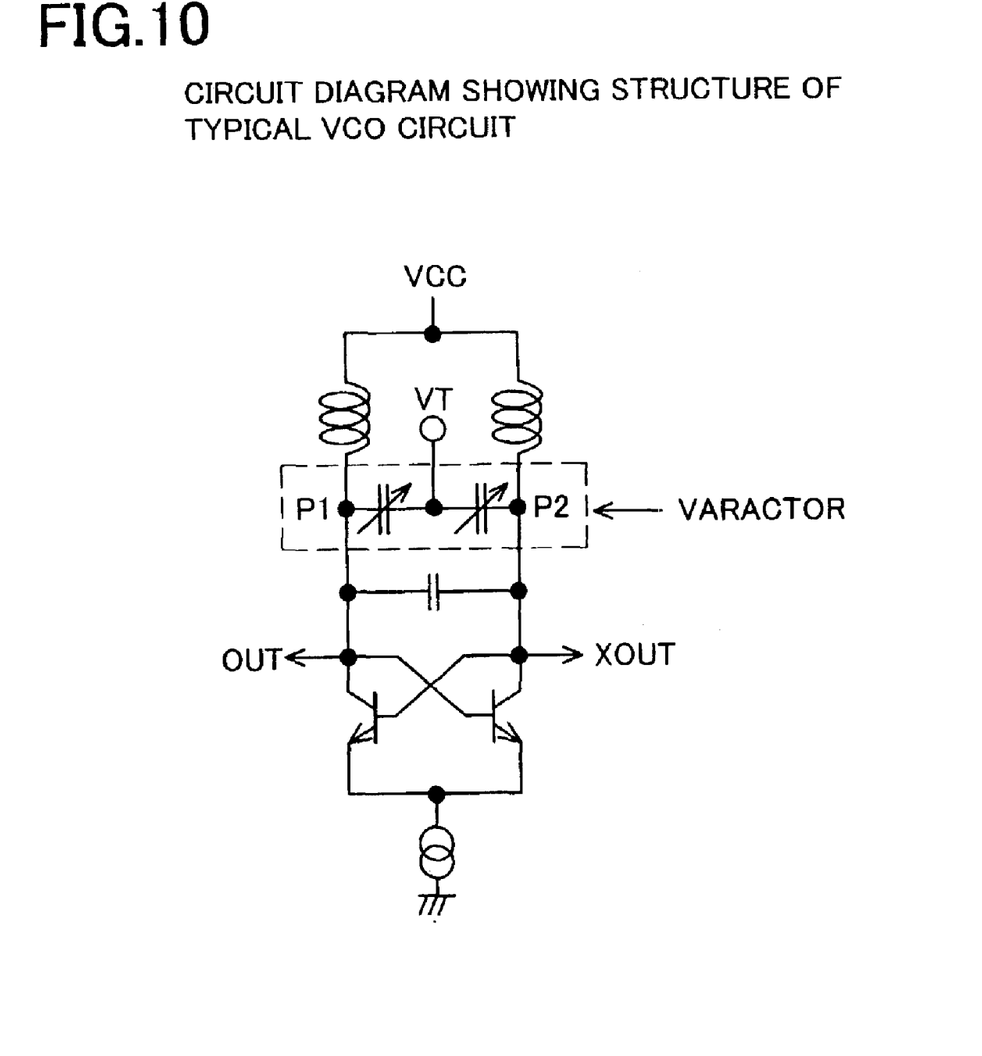
FIG. 10 is a circuit diagram showing structure of typical VCO circuit.

As an example of a circuit employing a varactor, a voltage control oscillation circuit (hereinafter referred to as "VCO circuit") can be mentioned. FIG. 10 shows a typical structure of the VCO circuit. This VCO circuit contains two varactors in an area surrounded by dotted line. Then, a control voltage VT is applied to their joint section. Thus, the capacity can be adjusted by adjusting the control voltage VT. For the reason, the VCO circuit is capable of controlling LC resonance frequency according to the control voltage VT. Generally, in such a VCO circuit, a ratio between carrier and noise (expressed in an absolute value, which is referred to as "C/N ratio" hereinafter) is preferred to be as large as possible.

However, the aforementioned conventional technology has following problems. That is, the C/N ratio of the VCO circuit cannot be increased so much. The reason is that a resistance of the circuit is large. Because the resistance is large, Q-value is small so that the C/N ratio is small. In order to improve the C/N ratio, it can be considered to reduce Kv (a ratio of a change amount of resonance frequency with respect to the change amount of the control voltage VT). If it is intended to achieve this with the characteristic of the varactor, it is recommendable to use a varactor having a mild change in capacity with respect to a change of the control voltage VT. However, generally, this kind of the varactor is not so an effective resolution because its own Q-value is so small. Further, a resistance of wiring section between the two varactors cannot be neglected. Thus, this is an obstacle to a trial for building VCO circuits in an integrated circuit.

SUMMARY OF THE INVENTION

The present invention has been made to resolve the above-described problems. It is intended provide a pn varactor that has a small resistance and can cope with being built in an integrated circuit of a circuit that uses LC resonance.

To achieve the object, according to one aspect of the present invention, there is provided a pn varactor using pn junctions as variable capacitance capacitor, the pn varactor comprising: a one-conduction-type semiconductor region arranged in a semiconductor substrate; and a first other-conduction-type semiconductor region and a second other-conduction-type semiconductor region arranged both sides of the one-conduction-type semiconductor region and constituting pn junctions together with the one-conduction-type semiconductor region, wherein a pn junction of the one-conduction-type semiconductor region and the first other-conduction-type semiconductor region and a pn junction of the one-conduction-type semiconductor region and the second other-conduction-type semiconductor region are used as a first varactor and a second varactor, respectively, electrostatic capacitances of which vary depending on potential applied to the one-conduction-type semiconductor region.

In the inventive pn varactor, the first varactor and the second varactor directly connect each other without passing through wirings outside a semiconductor substrate. Therefore, a resistance value is small and a Q value is large. Accordingly, a large C/N ratio can be obtained in case the pn varactor is used for VOC circuit.

Furthermore, it is preferable that the inventive pn varactor further comprises a pseudo-gate pattern on the one-conduction-type semiconductor region, wherein the pseudo-gate pattern, the one-conduction-type semiconductor region, the first other-conduction-type semiconductor region, and the second other-conduction-type semiconductor region constitute pseudo-FET structure. That is, the one-conduction-type semiconductor region is arranged below the pseudo-gate pattern.

In the inventive pn varactor, the first varactor and the second varactor are quite closely arranged. The shortest distance between those varactors is just as long as a channel length the pseudo-FET structure is assumed as FET. Therefore, a resistance value is small and a Q value is large. Accordingly, a large C/N ratio can be obtained in case the pn varactor is used for VOC circuit. It should be noted that "pseudo-FET structure" means structure that is structurally like FET but does not work as so. That is, the pseudo-gate pattern structurally corresponds to gate electrodes of FET, however, it cannot make the first and the second other-conduction type semiconductor regions turned on since no gate voltage is applied there to.

Furthermore, it is preferable that the inventive pn varactor further comprises a first dummy pattern and a second dummy pattern arranged above of opposite end of the pseudo-gate pattern on the first other-conduction-type semiconductor region and on the second other-conduction-type semiconductor region, respectively. That is, the pseudo-gate pattern on the first other-conduction-type semiconductor region and on the second other-conduction-type semiconductor region determines the opposite end. Thereby, it prevent capacity of the first and second varactors from being imbalanced regardless of pseudo-gate pattern that is placed off toward a direction perpendicular to its longitudinal direction. Alternatively, the inventive pn varactor may include a dummy pattern arranged above of entire periphery of the first and second other-conduction-type semiconductor regions. Since there is the dummy pattern surrounding the entire periphery, capacity balance of the first and second varactors can be kept regardless of positional deviation direction.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Hereinafter, the preferred embodiment of the present invention will be described in detail with reference to the accompanying drawings. According to this embodiment, the present invention is embodied in a varactor section in case where the VCO circuit as shown in FIG. 10 is built in an integrated circuit.

[First Embodiment]

Figure 1:
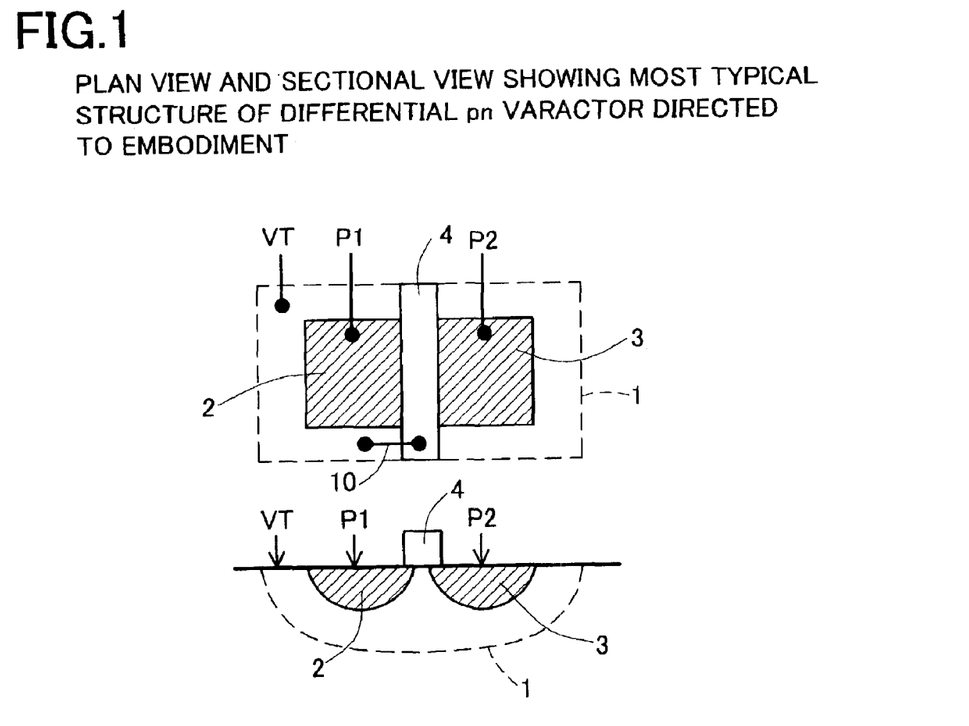
FIG. 1 is a plan view and a sectional view showing most typical structure of a differential pn varactor directed to an embodiment.

FIG. 1 shows a plan view and a sectional view of a differential pn-varactor according to the first embodiment. This differential pn-varactor includes two $p^+$ diffusion regions 2, 3 in a n-well 1. A dummy gate pattern 4 is provided over a region between the $p^+$ diffusion regions 2 and 3. Further, the dummy gate pattern 4 and the n-well 1 are connected through a wiring 10.

This structure is achieved as follows. That is, first, the n-well 1 is formed in a semiconductor wafer. After that, the dummy gate pattern 4 is formed by film formation technology such as CVD and pattern etching such that it is insulated from the semiconductor wafer. As the dummy gate pattern 4, the same layer as one used as a gate electrode of a MOS transistor in other section of the semiconductor wafer is used. Then, formation of the $p^+$ diffusion regions 2, 3 is carried out by ion plantation. At this time, the dummy gate pattern 4 acts as an inhibition mask. Thus, the $p^+$ diffusion regions 2 and 3 are formed such that they are separated from each other below the dummy gate pattern 4. This procedure is substantially the same as manufacturing procedure for a general type MOS transistor. Upon formation of wiring layer after that, the wiring 10 and other wirings are formed.

In the structure of FIG. 1, pn junction exists between the n-well 1 and the $p^+$ diffusion region 2. Further, pn-junction also exists between the n-well 1 and the $p^+$ diffusion region 3. Namely, the two pn-junctions exist across the n-well 1 such that they are very nearby. That is, an interval between the two at their most nearby position is slightly smaller than the width of the dummy gate pattern 4 in the lateral direction of FIG. 1 or a gate length when the dummy gate pattern 4 is regarded as a gate electrode of the MOS transistor. In other words, that is a channel length when the structure of FIG. 1 is regarded as the MOS transistor. Further, areas of the respective pn-junctions may be considered to be equal to the areas of the $p^+$ diffusion regions 2, 3 as viewed on FIG. 1. The reason is that the n-type region of the n-well 1 exists below the $p^+$ diffusion regions 2, 3.

Figure 2:
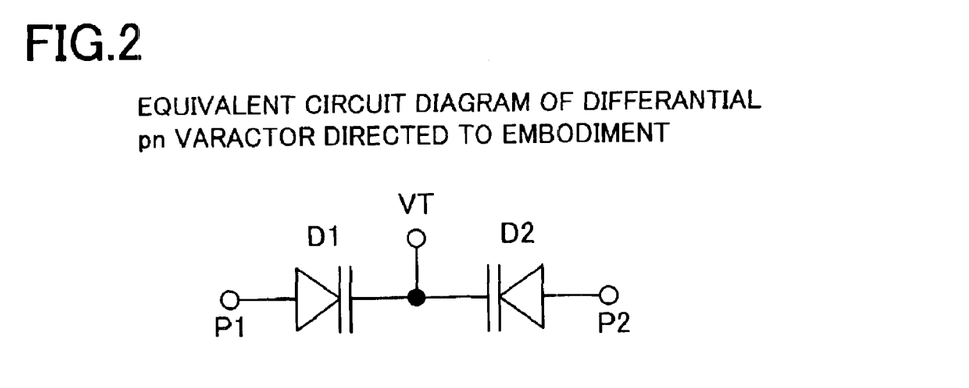
FIG. 2 is an equivalent circuit diagram of the differential pn varactor directed to the embodiment.

FIG. 2 shows an equivalent circuit of this structure. In the circuit of FIG. 2, the n-type regions of two pn-junction diodes D1, D2 are connected to each other. Then, the control voltage VT is applied to their joint section so as to bring it to a higher voltage than the both ends P1, P2. Consequently, the pn-junction diodes D1, D2 turn into reverse bias condition. At this time, the pn-junction diodes D1, D2 act as a pn-varactor whose capacity is changed by the control voltage VT. Further, in this case, the two pn-varactors are provided adjacent each other in a single element region so as to construct a differential pn-varactor.

The differential pn-varactor having such a structure can be applied to the VCO circuit shown in FIG. 10. A section surrounded by dotted line in FIG. 10 is replaced with the differential pn-varactor shown in FIGS. 1, 2. As a result, the control voltage VT is adjusted, so that the entire capacity of the circuit can be adjusted. For the reason, the VCO circuit can control the LC resonance frequency according to the control voltage VT.

The differential pn-varactor having this structure has such a feature that its Q value is very large. The reason is that the structure of the MOS transistor is applied as the differential pn-varactor. For the reason, the two pn-junction diodes D1, D2 are connected to each other not through any wiring layer outside the semiconductor wafer. Further, their gap is only as short as channel length of MOS transistor. Therefore, a series resistance of both the pn-junction diodes D1, D2 is remarkably small and the Q-value is large. Therefore, in the VCO circuit using this differential pn-varactor, phase noise relative to an oscillation signal is small. That is, the C/N ratio between carrier and noise is large.

In the meantime, the dummy gate pattern 4 of the differential pn-varactor of this structure has a similar structure as the gate electrode of MOS transistor. However, no gate voltage is applied. The reason is that the dummy gate pattern 4 forms no p-channel in the n-type region between the $p^+$ diffusion regions 2 and 3. For the reason, the dummy gate pattern 4 is connected to the n-well 1 through the wiring 10. That is, by always keeping the dummy gate pattern 4 and the n-well 1 at the same potential, a possibility that the differential pn-varactor may act as the MOS transistor is eliminated. Further, capacity between the dummy gate pattern 4 and the n-well 1 is not used.

[Second Embodiment]

Figure 3:
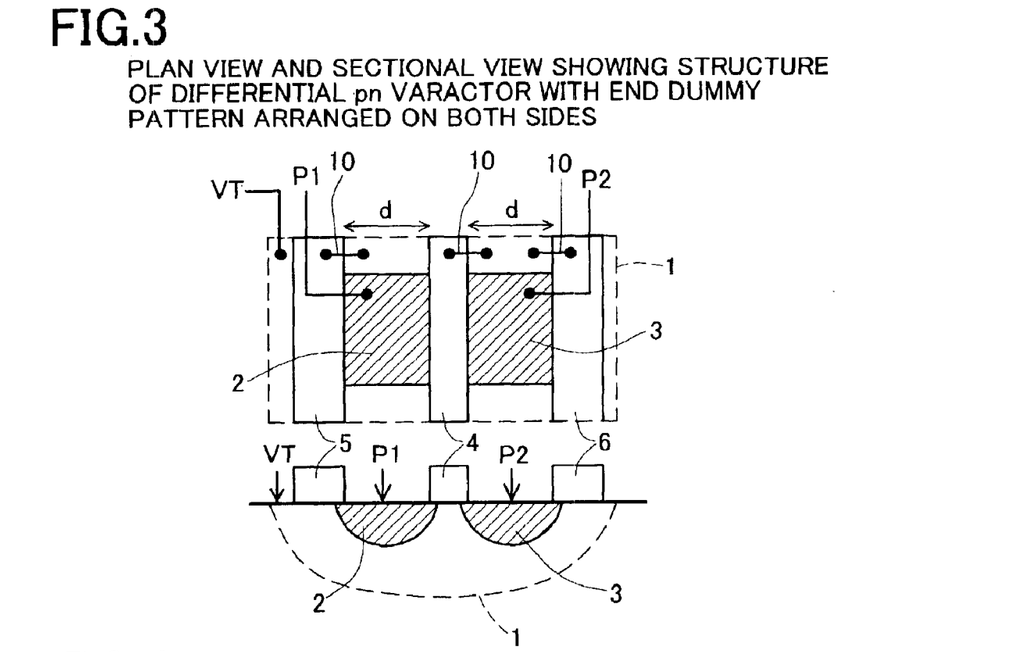
FIG. 3 is a plan view and a sectional view showing structure of a differential pn varacor with end dummy pattern arranged on both sides.

FIG. 3 shows a plan view and a sectional view of the differential pn-varactor of the second embodiment. This differential pn-varactor is constituted of the differential pn-varactor of the first embodiment shown in FIG. 1 plus end dummy patterns 5, 6. The end dummy patterns 5, 6 are provided in parallel to the dummy gate pattern 4. The interval between each of the end dummy patterns 5, 6 and the dummy gate pattern 4 is d. The end dummy patterns 5, 6 are formed through the same film formation process as the dummy gate pattern 4 and processed in the same pattern etching process. The dummy gate pattern 4 and the end dummy patterns 5, 6 are connected to the n well 1 through wirings 10.

Figure 4:
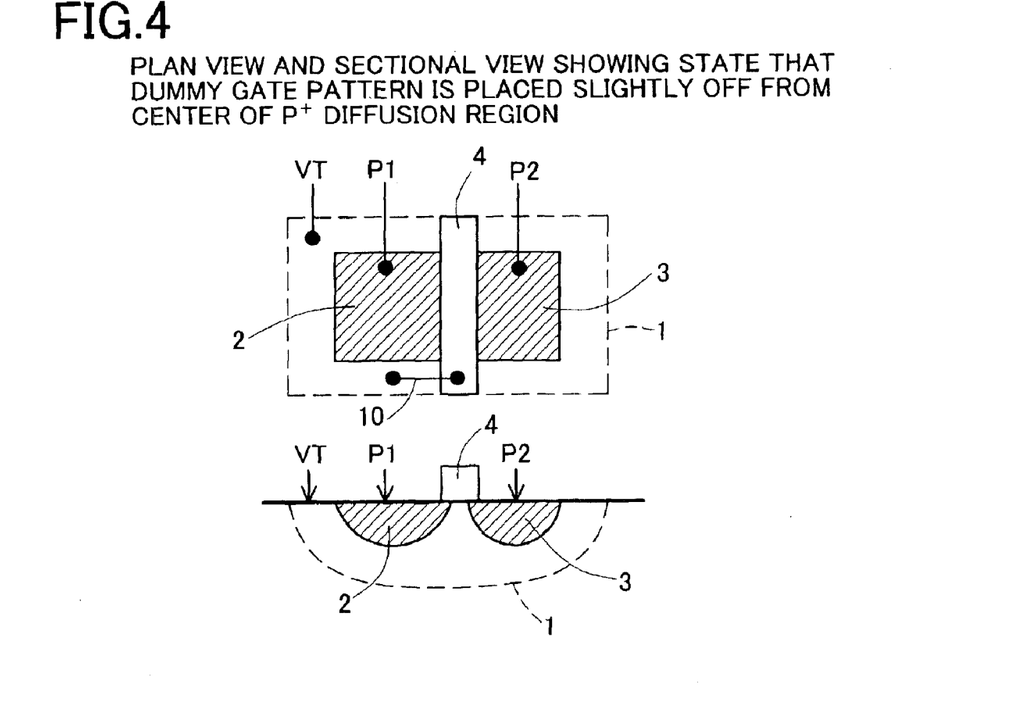
FIG. 4 is a plan view and a sectional view showing state that dummy gate pattern is placed slightly off from center of $p^+$ diffusion region.

The reason why the end dummy patterns 5, 6 are provided is to cope with manufacturing variation. That is, processing of the dummy gate pattern 4 and formation of the $p^+$ diffusion regions 2, 3 are carried out in separate processes. Thus, their relative positions may be deflected slightly as shown in FIG. 4. FIG. 4 indicates a state in which the dummy gate pattern 4 is deflected slightly rightward of the figure from the center of the entire p$^+$ diffusion regions 2, 3. In this state, the pn-junction of the p$^+$ diffusion region 2 has a little larger area than the pn-junction of the p$^+$ diffusion region 3. Thus, if considering of the equivalent circuit shown in FIG. 2, the capacity of the varactor D1 is slightly larger than the capacity of the varactor D2. Such an imbalance affects the oscillation characteristic of the VCO circuit. More specifically, nothing but an output signal having a small amplitude can be obtained. The reason is that the VCO circuit is affected by a smaller output of outputs on right and left resonance circuits of FIG. 10.

The differential pn-varactor of FIG. 3 has following advantages because of provision of the end dummy patterns 5, 6. That is, even if a deflection in position in the right/left direction of FIG. 3 exists between the dummy gate pattern 4 and the p$^+$ diffusion regions 2, 3, no imbalance occurs in the capacity. The reason is that if such a deflection in position exists, the end dummy patterns 5, 6 are also deflected in the same way. Thus, the interval d between the end dummy pattern 5, 6 and the dummy gate pattern 4 is unchangeable regardless of whether or not such a deflection in position exists. Then, the end dummy patterns 5, 6 act as a mask for forming the p$^+$ diffusion regions 2, 3 like the dummy gate pattern 4. Therefore, the balance between the capacity of the varactor D1 and the capacity of the varactor D2 is maintained regardless of whether or not the deflection in position exists. For the reason, the VCO circuit adopting the differential pn-varactor hardly misses a predetermined oscillation performance because of the deflection in position. The reason why such an effect is created is that the dummy gate pattern 4 and the end dummy patterns 5, 6 are produced by processing the same layer with the same mask.

Figure 5:
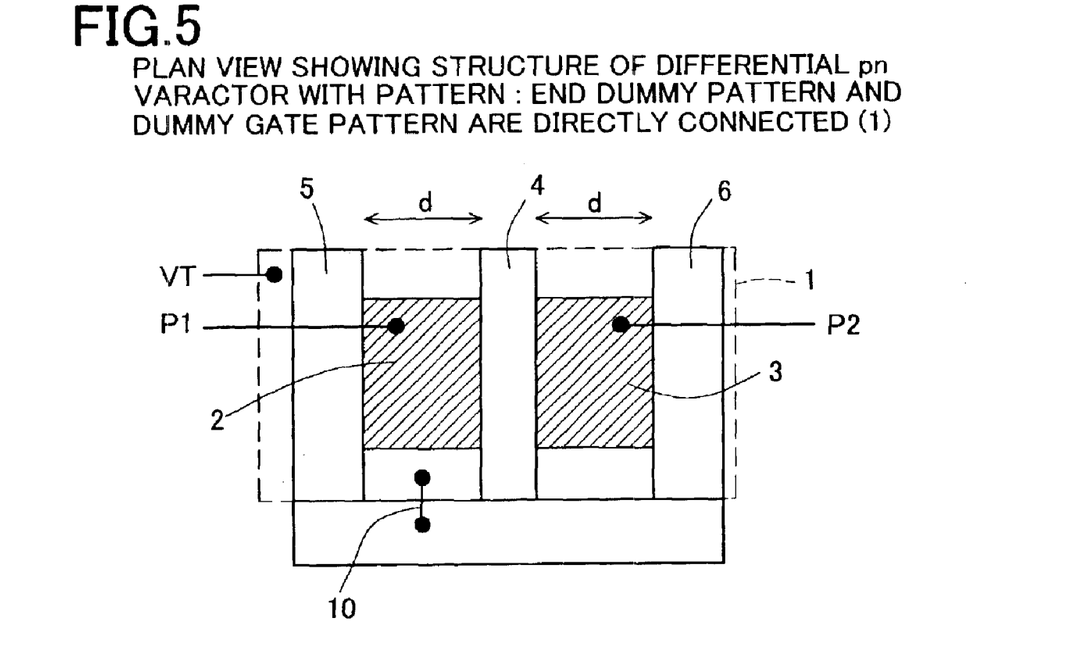
FIG. 5 is a plan view showing structure of a differential pn varactor with pattern: end dummy pattern and dummy gate pattern are directly connected (1)
Figure 6:
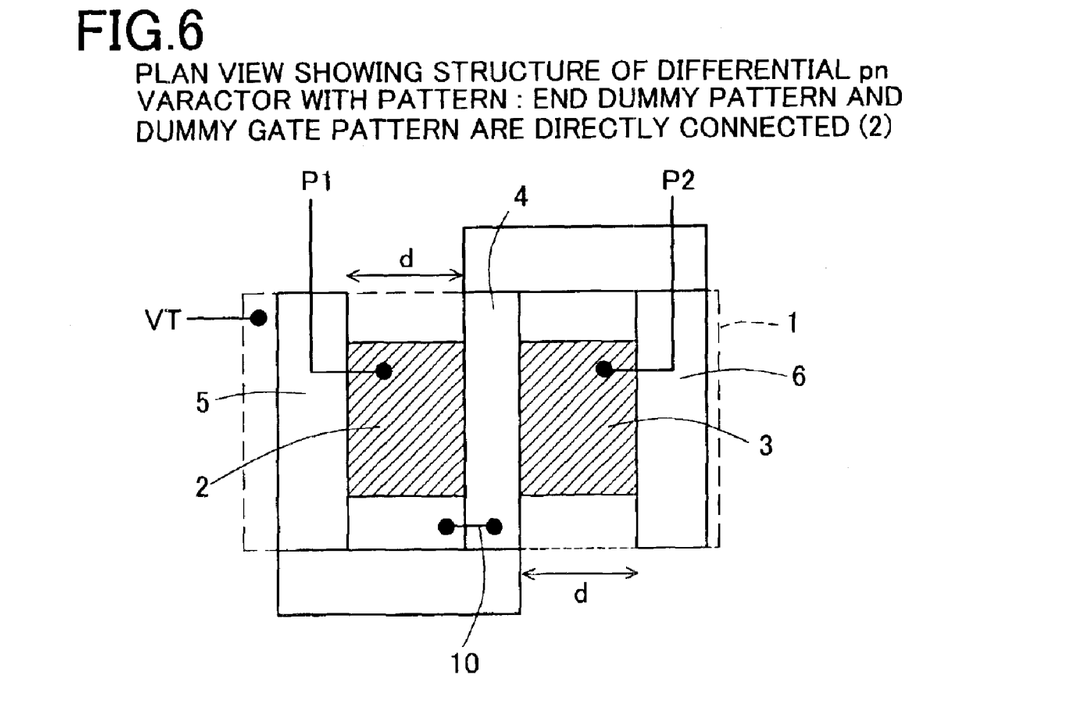
FIG. 6 is a plan view showing structure of a differential pn varactor with pattern: end dummy pattern and dummy gate pattern are directly connected (2)

In the meantime, the end dummy patterns 5, 6 always maintain an equal potential to the n-well 1 like the dummy gate pattern 4. The reason is that all these components are connected to the n-well 1 through the wirings 10. Consequently, the dummy gate pattern 4 and the end dummy patterns 5, 6 are prevented from having a different potential to the n-well 1 and affecting the operation of the differential pn-varactor. In the meantime, it is permissible to connect the dummy gate pattern 4 and the end dummy patterns 5, 6 through the wiring level and then connect only any one thereof to the n-well 1. Alternatively, as shown in FIGS. 5, 6, it is permissible to adopt a pattern in which the end dummy patterns 5, 6 and the dummy gate pattern 4 are connected directly to each other. In this case, one place of the end dummy patterns 5, 6 and the dummy gate pattern 4 only has to be connected to the n-well 1.

[Third Embodiment]

Figure 7:
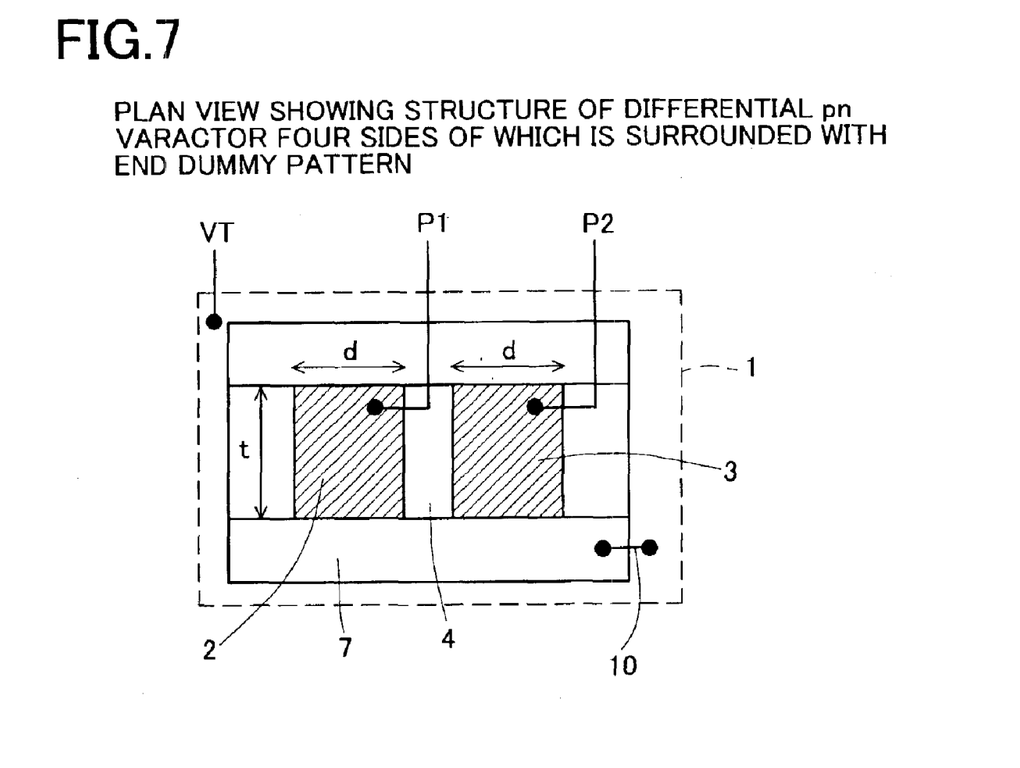
FIG. 7 is a plan view showing structure of a differential pn varactor four sides of which is surrounded with end dummy pattern.

The exclusion of such an influence of the deflection in position by end dummy pattern is possible not only in the right/left direction in the same Figure but also in the vertical direction. The third embodiment shown in FIG. 7 is an example which achieves this fact. That is, in this example, the end dummy pattern 7 is provided around the entire p$^+$ diffusion regions 2, 3. Needless to say, the end dummy pattern 7 is formed in the same film formation process of the dummy gate pattern 4 and processed by the same pattern etching process. In the differential pn-varactor of FIG. 7, if the deflection in position exists, the dummy gate pattern 4 and the end dummy pattern 7 are entirely deflected both in the right/left direction and the vertical direction. Thus, a size d in the lateral direction and a size t in the vertical direction of the p$^+$ diffusion regions 2, 3 are constant despite the deflection in position. That is, the area of an opening for forming the p$^+$ diffusion regions 2, 3 is completely settled. Therefore, a balance between the capacity of the varactor D1 and the capacity of the varactor D2 is kept excellent regardless of the deflection in position. In case of the differential pn-varactor of FIG. 7, one place of the dummy gate pattern 4 and the end dummy pattern 7 only has to be connected to the n-well 1.

As evident from the above description, there is no substantial difference between the dummy gate pattern and the end dummy pattern. Thus, in the differential pn-varactor shown in FIG. 7, it can be considered that the dummy gate pattern is provided not only between the p$^+$ diffusion regions 2 and 3 but also entirely around the p$^+$ diffusion regions 2, 3. Then, it can be considered that the p$^+$ diffusion regions 2, 3 are disposed at cells partitioned by the dummy gate pattern.

[Fourth Embodiment]

Figure 8:
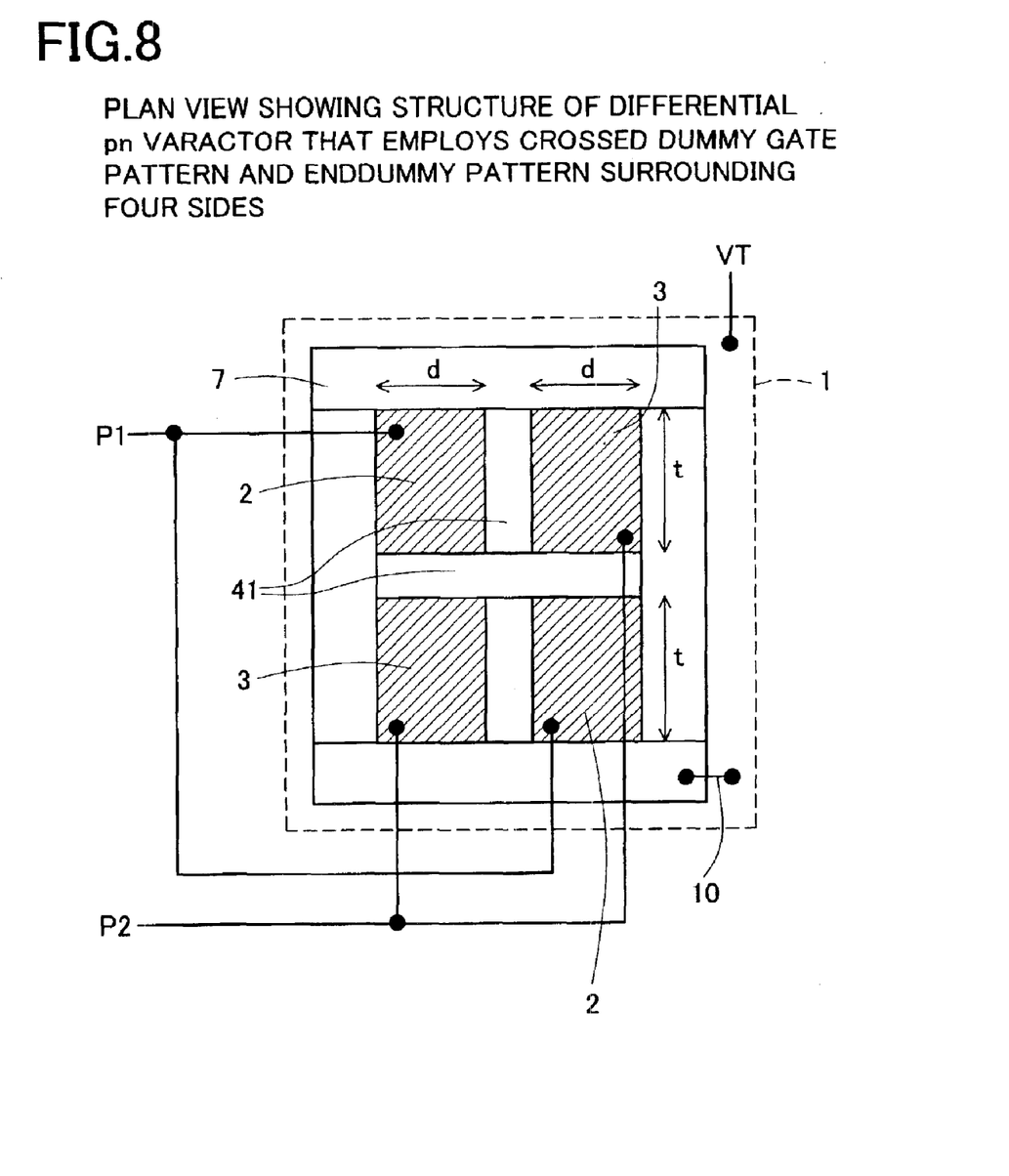
FIG. 8 is a plan view showing structure of a differential pn varactor that employs crossed dummy gate pattern and end dummy pattern surrounding four sides.

FIG. 8 shows a plan view of the differential pn-varactor according to the fourth embodiment. This differential pn-varactor adopts a crossed dummy gate pattern 41 and an end dummy pattern 7 surrounding the entire periphery of the p$^+$ diffusion regions 2, 3. The dummy gate pattern 41 and the end dummy pattern 7 entirely form a lattice pattern. Then, the p$^+$ diffusion regions 2, 3 are disposed alternately in four sections separated by the dummy gate pattern 41. Needless to say, crosswise n-well 1 exists below the crosswise dummy gate pattern 41 so as to partition the p$^+$ diffusion regions 2, 3. In the differential pn-varactor of FIG. 8, parallel connection of the pn-junction diodes in the two p$^+$ diffusion regions 2 corresponds to the varactor D1. Likewise, the parallel connection of the pn-junction didodes in the two p$^+$ diffusion regions 3 corresponds to the varactor D2.

Needless to say, in the differential pn-varactor of FIG. 8, the capacity of the respective p$^+$ diffusion regions 2, 3 is not affected by the deflection in position. In addition, the same differential pn-varactor has following features. That is, the Q-value is much larger than the above-described embodiments. The reason is that a connecting area between the varactor D1 and the varactor D2 is about twice, because the connecting area between the varactor D1 and the varactor D2 is proportional to the gate width in case where the dummy gate pattern is regarded as a gate electrode of the MOS transistor. This is an effect obtained by forming the dummy gate pattern in a crosswise fashion so as to narrow the p$^+$ diffusion region and connecting the p$^+$ diffusion regions located diagonally with each other. Such an arrangement ensures a sufficient connecting area between the varactors without increasing the element area.

As described above, there is no substantial difference between the dummy gate pattern and the end dummy pattern. Therefore, in the differential pn-varactor shown in FIG. 8, it can be considered that the dummy gate pattern is provided in a lattice fashion and the p$^+$ diffusion regions 2, 3 are disposed alternately in cells partitioned by the dummy gate pattern.

[Fifth Embodiment]

Figure 9:
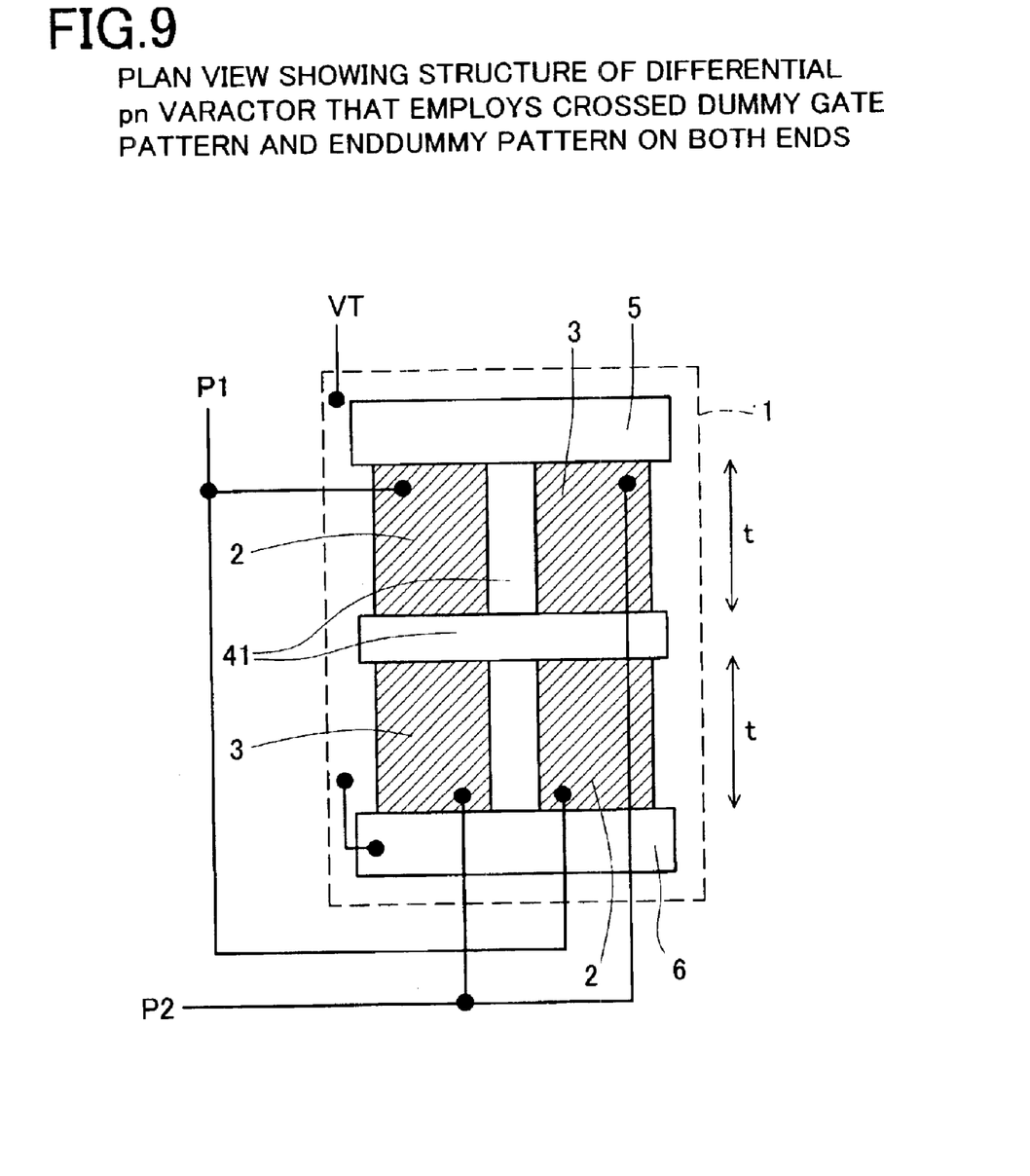
FIG. 9 is a plan view showing structure of a differential pn varactor that employs crossed dummy gate pattern and end dummy pattern on both ends.

FIG. 9 shows a plan view of the differential pn-varactor according to the fifth embodiment. This differential pn-varactor is comprised of crossed dummy gate pattern 41 and the end dummy patterns 5, 6 on both ends of the p$^+$ diffusion regions 2, 3. The p$^+$ diffusion regions 2, 3 are arranged alternately in the same way as the fourth embodiment shown in FIG. 8. This differential pn-varactor has such an advantage that its entire element area is smaller than the fourth embodiment. The reason is that the end dummy pattern is partly removed. For the reason, this embodiment is effective in viewpoint of high integration.

Even if the end dummy pattern is not provided on the entire periphery, little imbalance occurs in the capacitor. The reason is that even if the dummy gate pattern 41 and the end dummy patterns 5, 6 are deflected slightly to the right with respect to the p⁺ diffusion regions 2, 3, the total area of the two p⁺ diffusion regions 2 and the total area of the two p⁺ diffusion regions 3 are hardly changed. Because the p⁺ diffusion region 2 on the right bottom is reduced although the p⁺ diffusion region 2 on the left top is enlarged, consequently the changes in area are cancelled by each other. The same thing can be said about the p⁺ diffusion region 3.

As described in detail above, the differential pn-varactor of this embodiment has a similar structure to the MOS transistor. Consequently, a structure that two pn-varactors are disposed near each other not through any wiring outside a semiconductor wafer is achieved. Therefore, the differential pn-varactor of this embodiment has following several advantages. First, series resistance of the two pn-varactors is very small. Thus, its Q-value is large and when it is adopted in a VCO circuit, the C/N ratio is large. This fact is advantageous for achieving a VCO circuit having a small Kv. Further, providing with the wiring 10 keeps the dummy gate pattern always at the same potential as the n-well 1. Thus, a possibility that the differential pn-varactor may act as a MOS transistor is excluded. In the meantime, although a capacity exists between the dummy gate pattern and the n-well 1, the differential pn-varactor does not use that capacity.

Further, because basically the structure of the MOS transistor is adopted, this embodiment can be achieved by using existing process technology for the MOS transistor. For the reason, no new process technology has to be developed. This means that a design rule related to the gate length of the MOS transistor can be applied to a distance between the pn-junctions of the differential pn-varactor. This also contributes to drop of the series resistance of the element.

According to the second embodiment and the like, the end dummy pattern is provided on both ends or on the entire periphery of the p⁺ diffusion regions 2, 3. Then, the dummy gate pattern and the end dummy pattern are formed in the same film formation process and processed in the same pattern etching process. Consequently, even if a slight deflection exists between the dummy gate pattern and the p⁺ diffusion regions 2, 3, imbalance in capacity between the two pn-varactors is inhibited. Thus, a drop in performance of the VCO circuit due to the imbalance in the capacity is excluded. Consequently, the entire VCO circuit including the differential pn-varactor can be built into an integrated circuit.

According to the fourth embodiment and the like, the dummy gate pattern is formed in crosswise or lattice fashion and the p⁺ diffusion regions 2, 3 are disposed alternately in each cell. Consequently, a sufficient connecting area is secured between the pn-varactors thereby lowering resistance value further.

In the meantime, this embodiment is a mere example and does not restrict the present invention in any way. Therefore, needless to say, the present invention may be improved or modified in various ways within a scope not departing from the gist thereof.

For example, in the above-described respective embodiments, a possibility that the differential pn-varactor may act as a MOS transistor is excluded by connecting the dummy gate pattern and the end dummy pattern to the n-well 1 through the wiring 10. As a substitutive means, applying reverse bias to the dummy gate pattern and the end dummy pattern can be picked up. In this case, the wiring 10 for connecting the dummy gate pattern and the end dummy pattern to the n-well 1 is not provided. In this way, a possibility that the differential pn-varactor may act as a MOS transistor is excluded.

As another means, removing the dummy gate pattern and the end dummy pattern after the p⁺ diffusion regions 2, 3 are formed can be considered. The reason is that although the dummy gate pattern and the end dummy pattern act as an inhibition mask when the p⁺ diffusion regions 2, 3 are formed by implanting ions, they don't form any part of a circuit after the element is completed. However, generally, there is a high possibility that the same layer as the dummy gate pattern and the end dummy pattern is used as the gate electrode of the MOS transistor at other place in the semiconductor wafer. Thus, only the dummy gate pattern and the end dummy pattern of the differential pn-varactor have to be removed without removing the gate electrode of the MOS transistor.

As still another means, forming the dummy gate pattern and the end dummy pattern of an insulation material can be considered. However, that insulation material needs to act as an inhibition mask against ion implantation when the p⁺ diffusion regions 2, 3 are formed.

As other modification, making the lattice pattern of the dummy gate pattern 41 smaller in the fourth or fifth embodiment can be considered. In this case, the number of the p⁺ diffusion regions 2, 3 have to be equal. Further, a structure in which the p-type and the n-type are replaced with each other can be considered. Namely, the p-type region exists below the dummy gate pattern and the n-diffusion region is formed adjacently. Needless to say, the control voltage VT for this case has to be lower than the voltages P1, P2 at both ends. Further, this embodiment can be adapted to not only the VCO circuit but also pn-varactor in other circuit.

As evident from the above description, according to the present invention, there is provided a pn-varactor having a small resistance and capable of coinciding with incorporation of a circuit employing LC resonance into an integrated circuit. Further, there is also provided a pn-varactor which can be manufactured by employing process technology of the MOS transistor as it is. Further, there is provided a pn-varactor unlikely to be affected by positioning accuracy in manufacturing process. Therefore, incorporation of such a varactor into the integrated circuit is facilitated.

What is claimed is:

1. A pn varactor using pn junctions as variable capacitance capacitor, the pn varactor comprising:

a one-conduction-type semiconductor region arranged in a semiconductor substrate;

a first other-conduction-type semiconductor region and a second other-conduction-type semiconductor region arranged both sides of the one-conduction-type semiconductor region and constituting pn junctions together with the one-conduction-type semiconductor region;

a pseudo-gate pattern on the one-conduction-type semiconductor region;

a first dummy pattern arranged above of opposite end of the pseudo-gate pattern on the first other-conduction-type semiconductor region; and a second dummy pattern arranged above of opposite end of the pseudo-gate pattern on the second other-conduction-type semiconductor region, wherein the pseudo-gate pattern, the one-conduction-type semiconductor region, the first other-conduction-type semiconductor region, and the second other-conduction-type semiconductor region constitute pseudo-FET structure, and wherein a pn junction of the one-conduction-type semiconductor region and the first other-conduction-type semiconductor region and a pn junction of the one-conduction-type semiconductor region and the second other-conduction-type semiconductor region are used as a first varactor and a second varactor, respectively, electrostatic capacitances of which vary depending on potential applied to the one-conduction-type semiconductor region.

2. A pn varactor according to claim 1, wherein the first dummy pattern and the second dummy pattern are processed in a same manner as the pseudo-gate pattern is processed.

3. A pn varactor according to claim 1, wherein the first dummy pattern and the second dummy pattern are obtained by processing a layer same as a layer of the pseudo-gate pattern.

4. A pn varactor according to claim 2, wherein the first dummy pattern and the second dummy pattern are obtained by processing a layer same as a layer of the pseudo-gate pattern.

5. A pn varactor according to claim 1, further comprising an inversion inhibiting means for inhibiting inversion of the one-conduction-type semiconductor region due to the first dummy pattern and the second dummy pattern.

6. A pn varactor using pn junctions as variable capacitance capacitor, the pn varactor comprising:
a one-conduction-type semiconductor region arranged in a semiconductor substrate and formed crosswise;
pluralities of first other-conduction-type semiconductor region and pluralities of second other-conduction-type semiconductor region arranged at portions partitioned by the one-conduction-type semiconductor region and constituting pn junctions together with the one-conduction-type semiconductor region; and
a pseudo-gate pattern formed crosswise on the one-conduction-type semiconductor region,
wherein the pseudo-gate pattern, the one-conduction-type semiconductor region, the first other-conduction-type semiconductor region, and the second other-conduction-type semiconductor region constitute pseudo-FET structure,
and wherein a pn junction of the one-conduction-type semiconductor region and the first other-conduction-type semiconductor region and a pn junction of the one-conduction-type semiconductor region and the second other-conduction-type semiconductor region are used as a first varactor and a second varactor, respectively, electrostatic capacitances of which vary depending on potential applied to the one-conduction-type semiconductor region.

7. A pn varactor according to claim 6, wherein pluralities of the first other-conduction-type semiconductor region and pluralities of the second other-conduction-type semiconductor region are arranged in diagonal to each portion partitioned by the one-conduction-type semiconductor region.

8. A pn varactor using pn junctions as variable capacitance capacitor, the pn varactor comprising:
a one-conduction-type semiconductor region arranged in a semiconductor substrate;
a first other-conduction-type semiconductor region and a second-other-conduction-type semiconductor region arranged both sides of the one-conduction-type semiconductor region and constituting on junctions together with the one-conduction-type semiconductor region;
a pseudo-gate pattern on the one-conduction-type semiconductor region, and a dummy pattern arranged above of entire periphery of the first other-conduction-type semiconductor region and the second other-conduction-type semiconductor region,
wherein the pseudo-gate pattern, the one-conduction-type semiconductor region, the first other-conduction-type semiconductor region, and the second other-conduction-type semiconductor region constitute pseudo-FET structure,
and wherein a pn junction of the one-conduction-type semiconductor region and the first other-conduction-type semiconductor region and a pn junction of the one-conduction-type semiconductor region and the second other-conduction-type semiconductor region are used as a first varactor and a second varactor, respectively, electrostatic capacitances of which vary depending on potential applied to the one-conduction-type semiconductor region.

9. A pn varactor according to claim 6 further comprising a dummy pattern arranged above of entire periphery of pluralities of the first other-conduction-type semiconductor region and pluralities of the second other-conduction-type semiconductor region.

10. A pn varactor according to claim 8 wherein the dummy pattern is processed in a same manner as the pseudo-gate pattern is processed.

11. A pn varactor according to claim 9 wherein the dummy pattern is processed in a same manner as the pseudo-gate pattern is processed.

12. A pn varactor according to claim 8, wherein the dummy pattern is obtained by processing a layer same as a layer of the pseudo-gate pattern.

13. A pn varactor according to claim 9, wherein the dummy pattern is obtained by processing a layer same as a layer of the pseudo-gate pattern.

14. A pn varactor according to claim 8 further comprising an inversion inhibiting means for inhibiting inversion of the one-conduction-type semiconductor region due to the dummy gate pattern.

15. A pn varactor according to claim 9 further comprising an inversion inhibiting means for inhibiting inversion of the one-conduction-type semiconductor region due to the dummy gate pattern.

16. A pn varactor using pn junctions as variable capacitance capacitor, the pn varactor comprising:
a one-conduction-type semiconductor region arranged in a semiconductor substrate and formed latticewise;
pluralities of first other-conduction-type semiconductor region and pluralities of second other-conduction-type semiconductor region arranged at cells partitioned by the one-conduction-type semiconductor region; and
a pseudo-pate pattern on the one-conduction-type semiconductor region,
wherein the pseudo-gate pattern, the one-conduction-type semiconductor region, the first other-conduction-type semiconductor region, and the second other-conduction-type semiconductor region constitute pseudo-FET structure,
and wherein a pn junction of the one-conduction-type semiconductor region and the first other-conduction-type semiconductor region and a pn junction of the one-conduction-type semiconductor region and the second other-conduction-type semiconductor region are used as a first varactor and a second varactor, respectively, electrostatic capacitances of which vary depending on potential applied to the one-conduction-type semiconductor region.

17. A pn varactor according to claim 16, wherein the pluralities of the first other-conduction-type semiconductor region and pluralities of the second other-conduction-type semiconductor region are arranged alternately on each cell partitioned by the one-conduction-type semiconductor region.

18. A pn varactor using pn junctions as variable capacitance capacitor, the pn varactor comprising:
- a one-conduction-type semiconductor region arranged in a semiconductor substrate;
- a first other-conduction-type semiconductor region and a second other-conduction-type semiconductor region arranged both sides of the one-conduction-type semiconductor region and constituting pn junctions together with the one-conduction-type semiconductor region;
- a pseudo-gate pattern on the one-conduction-type semiconductor region; and
- a wiring connecting the pseudo-gate pattern and the one-conduction-type semiconductor region, wherein the pseudo-gate pattern, the one-conduction-type semiconductor region, the first other-conduction-type semiconductor region, and the second other-conduction-type semiconductor region constitute pseudo-FET structure, and wherein a pn junction of the one-conduction-type semiconductor region and the first other-conduction-type semiconductor region and a pn junction of the one-conduction-type semiconductor region and the second other-conduction-type semiconductor region are used as a first varactor and a second varactor, respectively, electrostatic capacitances of which vary depending on potential applied to the one-conduction-type semiconductor region.

* * * * *